United States Patent [19]

Alexander et al.

[11] Patent Number: 5,392,186
[45] Date of Patent: Feb. 21, 1995

[54] PROVIDING VARIOUS ELECTRICAL PROTECTIONS TO A CMOS INTEGRATED CIRCUIT

[75] Inventors: James W. Alexander, Hillsboro; Louis Johnson, Beaverton, both of Oreg.

[73] Assignee: Intel Corporation, Santa Clara, Calif.

[21] Appl. No.: 962,886

[22] Filed: Oct. 19, 1992

[51] Int. Cl.[6] .............................. H02H 3/24
[52] U.S. Cl. ...................... 361/92; 361/88; 361/118
[58] Field of Search .................. 361/92, 91, 118, 88; 320/8, 15; 307/272, 443, 451, 592

[56] References Cited

U.S. PATENT DOCUMENTS

5,140,177  8/1992  Suda et al. ..................... 307/272
5,204,610  4/1993  Pierson et al. .................. 320/15

Primary Examiner—Marc S. Hoff
Assistant Examiner—S. Jackson
Attorney, Agent, or Firm—Blakely, Sokoloff, Taylor & Zafman

[57] ABSTRACT

The electrical protection circuit disclosed comprises a latchup detection circuit, a threshold detector, an oscillator, a charge pump, a switching circuit, a voltage reference and detection circuit, and a signaling circuit. The latchup detection circuit, the threshold detector, the oscillator, the charge pump, and the switching circuit cooperate to provide latchup protection for the CMOS integrated circuit. The switching circuit provides integrated reverse current protection to the CMOS integrated circuit. The voltage reference and detection circuit, the threshold detector, and the signaling circuit provides low voltage protection for the SRAM-based software-downloaded Field Programmable Gate Array of the CMOS integrated circuit.

12 Claims, 9 Drawing Sheets

PROVIDING VARIOUS ELECTRICAL PROTECTIONS TO A CMOS INTEGRATED CIRCUIT

BACKGROUND OF THE INVENTION

1. Field of the Invention

The present invention relates to the field of integrated circuit, more specifically, CMOS based integrated circuits. The present invention relates to providing various electrical protections to a CMOS integrated circuit.

2. Art Background

It is a well known fact that, under certain conditions, a parasitic pnpn junction would be created in a CMOS integrated circuit, resulting in the latchup and possibly destruction of the CMOS integrated circuit. For certain CMOS integrated circuits receiving power supply from more than one source, i.e. power being supplied through the inputs as well as from the $V_{cc}$ pins, one of such conditions is the power being supplied in an improper sequence. Particular examples of such CMOS integrated circuits are CMOS integrated circuits in a processor module with their $V_{cc}$ pins coupled to an in-circuit emulator (ICE), and their inputs coupled to an ISA bus having a number of drivers with large current delivery capacity.

Traditionally, integrated circuit designers have often relied on the fact that typically the operating characteristics of a CMOS integrated circuit are insufficient to surpass the high current threshold for triggering a latchup. The potential problem is simply ignored. Other times when the operating characteristics of a CMOS integrated circuit are sufficient to surpass even the high current threshold and trigger a latchup, it is often left up to the user to ensure that the power is applied in proper sequence.

Alternatively, a fuse or a polyfuse may be employed to protect the CMOS integrated circuit. A polyfuse is a self-closing circuit breaker. The use of a low cost one time fuse has the disadvantage of having to have the fuse replaced, each time it is blown. Such a requirement is often unacceptable, particularly in situations where the CMOS integrated circuits are used in a novice end user application, such as personal computer or consumer electronics. On the other hand, the use of a polyfuse has the disadvantages of being more costly, and having to wait for it to recloses.

As a further alternative, an intervening protection circuitry may be provided to enforce the sequence in which the power is to be applied. However, a practical intervening protection circuitry for a VLSI environment must be low in economic cost as well as hardware real estate cost.

On the other hand, it will be desirable if a low cost intervening protection circuitry could nevertheless provide protection against potential damages resulted from reverse current being sourced from one of the power supply to another power supply being deenergized unexpectedly. An intervening protection circuit between the deenergized power supply and the CMOS integrated circuits, in conjunction with the CMOS integrated circuits, may behave in such a manner, that allows current to be sourced from the drivers of the still energized power supply to the deenergized power supply. Since a deenergized power supply looks like a low impedance to ground, the drivers of the still energized power supply, the CMOS integrated circuits, as well as the intervening protection circuit itself could be strained beyond their maximum current ratings.

Furthermore, for CMOS integrated circuits comprising volatile SRAM-based software-downloaded Field Programmable Gate Array (FPGA), it will also be desirable if the low cost intervening protection circuit could also protect these SRAM-based FPGA from destructive reconfiguration as a result of low voltage.

As will be disclosed, the present invention provides a method and apparatus for providing various electrical protections to a CMOS integrated circuit that achieves the above described desired results.

SUMMARY OF THE INVENTION

A electrical protection circuit providing latchup, reverse current and low voltage protection to a CMOS integrated circuit is disclosed. The electrical protection circuit has particular application to protecting CMOS integrated circuits receiving power supplies from a power source A, and a power source B comprising a number of drivers with high current delivery capacity. The electrical protection circuit comprises a latchup detection circuit, a threshold detector, an oscillator, a charge pump, a switching circuit, a voltage reference and detection circuit, and a signaling circuit. The latchup detection circuit, the threshold detector, the oscillator, the charge pump, and the switching circuit cooperate to provide latchup protection for the CMOS integrated circuit. The switching circuit provides integrated reverse current protection to the CMOS integrated circuit. The voltage reference and detection circuit, the threshold detector and the signaling circuit provides low voltage protection for the SRAM-based FPGA of the CMOS integrated circuit.

The latchup detection circuit drives a RESET input of the threshold detector high in the absence of a latchup condition, and pulls the RESET input low in the presence of a latchup condition. A latchup condition exists, whenever any of the power supplies from power source B rises above a predetermined voltage ($V_B$), before the power supply from power source A rises above a predetermined voltage ($V_A$). The RESET input resets the threshold detector when it is driven low. The threshold detector gates the oscillator; it releases the oscillator's feedback path, allowing oscillation, when the RESET input is driven high, and grounds the oscillator's feedback path, preventing oscillation, when the RESET input is driven low. The oscillator, when allowed to oscillate, generates current pulses for the charge pump. The charge pump boosts the voltage, supplying the boosted voltage to the switching circuit, thereby closing the switching circuit. The switching circuit is designed to quickly open, whenever the boosted voltage is withdrawn. As a result, power from source A is provided to the CMOS integrated circuit whenever the power supply from power source A rises above $V_A$, before any of the power supplies from power source B rises above the predetermined voltage $V_B$, and deprived from the CMOS integrated circuit, whenever the converse is true.

The switching circuit comprises FET transistor switches. The FET transistor switches are connected in series at their sources, causing their parasitic zener diodes to be connected in opposing fashion. Thus, at any particular point in time, one of the parasitic zener diodes will be reversed biased. As a result, current will be shut off, whenever the FET transistor switches' gates are grounded, regardless whether theirs drains are energized, thereby preventing current to be sourced from power source B to power source A if power source A is deenergized unexpected while power source B is still energized.

The voltage reference and detection circuit provides voltage to pull the THRES input of the threshold detector above its trigger range upon detecting a low voltage condition, and allow the THRES input to fall below the trigger range in the absence of the low voltage condition. A low voltage condition exists when the voltage of power source A falls below $V_A$. Concurrently, the voltage reference and detection circuit causes the base-emitter junction of a transistor in the latchup detection circuit to be reverse biased upon detecting the low voltage condition. The latchup detection circuit grounds the TRIG and RESET inputs of the threshold detector, whenever the base-emitter junction of the particular transistor is reverse biased. The threshold detector, as a result of its RESET input being grounded, grounds the feedback path of the oscillator, preventing oscillation, thereby shutting off the charge pump, opening up the switching circuit, and depriving the CMOS integrated circuit of power from power source A. Additionally, the threshold detector, as a result of its THRES input being pulled above its trigger range, drives its OUT output low. In response to the OUT output of the threshold detector going low, the signaling circuit generates a number of signals indicating a low voltage condition.

In one embodiment, the signaling circuit generates two low voltage indicator signals, one for a configuration engine coupled to the SRAM-based FPGA of the CMOS integrated circuit, another one for an insolation gate coupled to the CMOS integrated circuit. Having been informed of the low voltage condition, the configuration engine reloads the SRAM-based FPGA when the fault is subsequently cleared. Upon notified of the low voltage condition, the isolation gate isolates the CMOS integrated circuit from other CMOS integrated circuits receiving power supply from power source B.

BRIEF DESCRIPTION OF THE DRAWINGS

The objects, features, and advantages of the present invention will be apparent from the following detailed description of the presently preferred and alternate embodiments of the invention with references to the drawings in which.

DETAILED DESCRIPTION PRESENTLY PREFERRED AND ALTERNATE EMBODIMENTS

A electrical protection circuit providing latchup, reverse current and low voltage protection to a CMOS integrated circuit is disclosed. The electrical protection circuit has particular application to CMOS integrated circuits receiving power supplies from a power source A, and a power source B comprising a number of drivers with high current delivery capacity. In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 1:
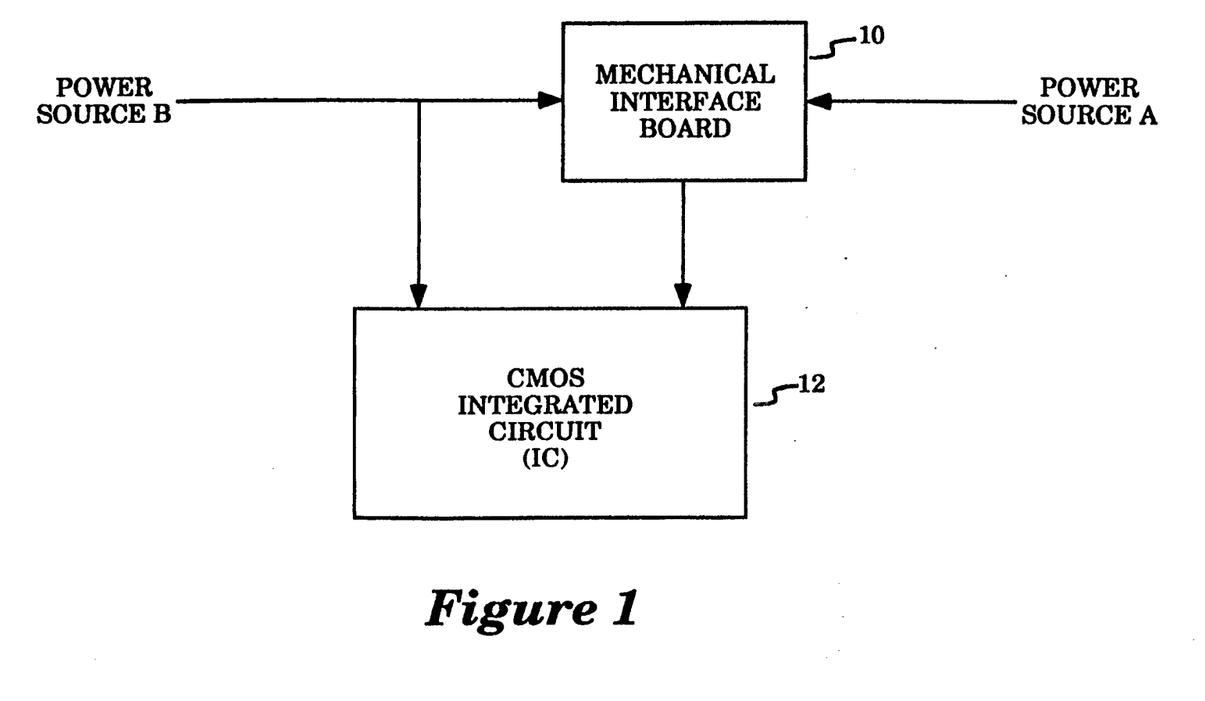
FIG. 1 illustrates one embodiment of the present invention for providing various electrical protections to a CMOS integrated circuit having more than one power supply.

Referring now to FIG. 1, a block diagram illustrating an embodiment of the present invention. Shown is a mechanical interface board 10 comprising the electrical protection circuit of the present invention coupled to a CMOS integrated circuit. The electrical protection circuit in the mechanical interface board 10 receives power supplies from both sources of the CMOS integrated circuit 12. The CMOS integrated circuit 12 receives one of its power supply from one of the sources (source A) indirectly through the electrical protection circuit in the mechanical interface board 10, and from the other source (source B) directly.

Power source A is intended to represent a broad category of main power supply to the CMOS integrated circuit, such as the ICE power supply to CMOS integrated circuits of a processor module described in the earlier example. Power source B is intended to represent a broad category of multiple secondary power supplies, such as the various power being supplied from the drivers of an ISA bus coupled to the processor module having large current delivery capacity as described in the earlier example.

While the present invention is being illustrated with the electrical protection circuit disposed in the mechanical interface board 10 of the CMOS integrated circuit 12, based on the descriptions to follow, it will be appreciated that the present invention may be practiced with the electrical protection circuit disposed on other media.

Figure 2:
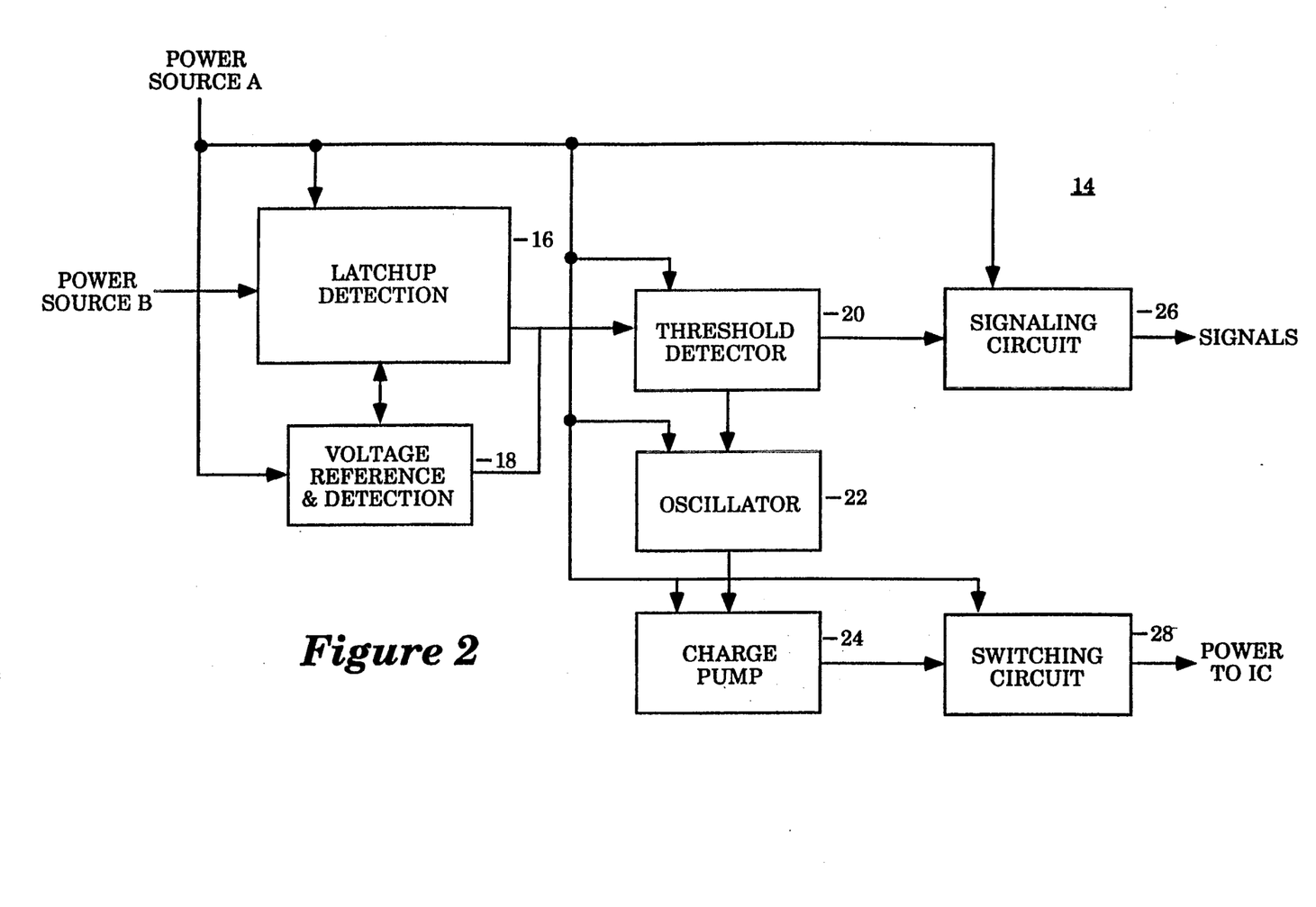
FIG. 2 illustrates a component view of the present invention.

Referring now to FIG. 2, a block diagram illustrating a component view of the electrical protection circuit of the present invention. The 1.5 electrical protection circuit 14 comprises a latchup detection circuit 16, a voltage reference and detection circuit 18, and a switching circuit 28. Additionally, the electrical protection circuit 14 comprises a threshold detector 20, an oscillator 22, a charge pump 24, and a signaling circuit 26. The latchup detection circuit 16, the threshold detector 20, the oscillator 22, the charge pump 24, and the switching circuit 28 cooperate to provide latch up protection for the CMOS integrated circuit. The switching circuit 28 provides integrated reverse current protection to the CMOS integrated circuit. The voltage reference and detection circuit 18, the threshold detector 20 and the signaling circuit 26 provides low voltage protection for the SRAM-based FPGA of the CMOS integrated circuit. The manner in which each of these electrical protections is effectuated through these components will be described in turn, with additional periodic references to the remaining figures, which illustrate these components in further detail.

Still referring to FIG. 2, latch up protection will first be described. The latchup detection circuit 16 is used to driver a RESET input of the threshold detector 20 high in the absence of a latchup condition, and drives the RESET input low in the presence of a latchup condition. A latchup condition exists, whenever any of the power supplies from power source B rises above a predetermined voltage ($V_B$), before the power supply from power source A rises above a predetermined voltage ($V_A$). The RESET input is used to reset the threshold detector 20, when it is driven low. The threshold detector 20 is used to gate the oscillator 22; it releases the feedback path of the oscillator 22, allowing oscillation, when its RESET input is driven high, and grounding the feedback path of the oscillator 22, preventing oscillation, when its RESET input is driven low. The oscillator 22, when allowed to oscillate, is used to generate current pulses for the charge pump 24. The charge pump 24 is used to boost voltage, and supply the boosted voltage to the switching circuit 28, thereby closing the switching circuit 28. The switching circuit 28 is designed to open quickly, when it is deprived of the boosted voltage. Thus, power from source A is provided to the CMOS integrated circuit whenever the power supply from power source A rises above $V_A$, before any of the power supplies from power source B rises above the predetermined voltage $V_B$, and deprived from the CMOS integrated circuit, whenever the converse is true.

Figure 3:
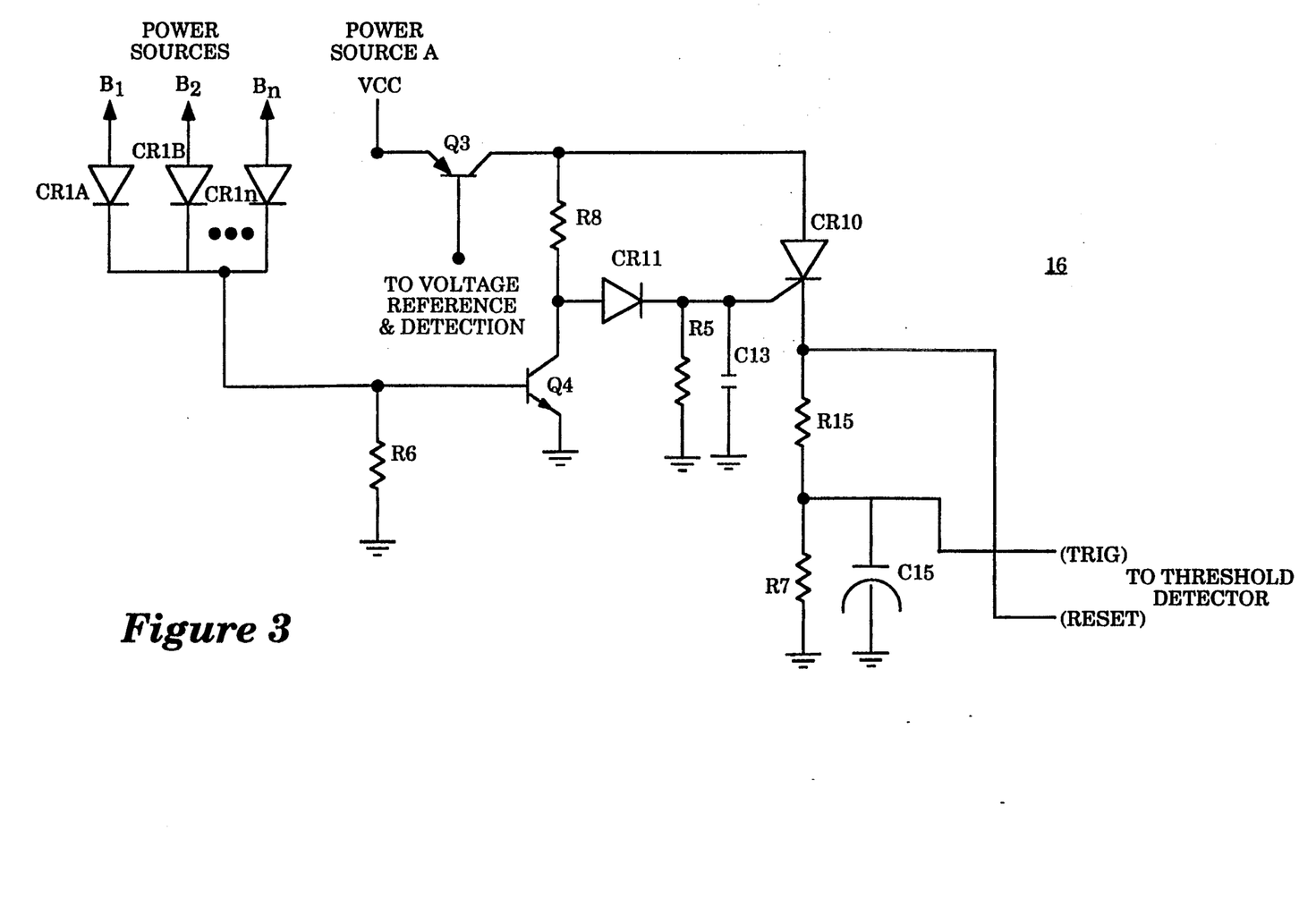
FIG. 3 illustrates the latch up protection circuit of the present invention.

Referring now FIG. 3, a circuit diagram illustrating the elements of the latchup detection circuit in further detail is shown. The latchup detection circuit 16 comprises a silicon controlled rectifier CR10, a diode CR11, a pnp transistor Q3, and a npn transistor Q4. The cathode of CR10 is coupled to a RESET pin of the threshold detector and a TRIG pin of the threshold detector through a resistor R15, the gate of CR10 is coupled to the cathode of CR11, and the anode of CR10 is coupled to the collector of Q3. The emitter of Q3 is coupled to power source A of the CMOS integrated circuit, and the base of Q3 is coupled to the voltage reference. The collector of Q4 is coupled to the connection of CR10 and Q3 through a resistor R8, the emitter of Q4 is coupled to ground, and the base of Q4 is coupled to the power sources of power source B of the CMOS integrated circuit. The anode of CR11 is coupled to the connection between the collector of Q4 and the resistor R8.

Additionally, the latchup detection circuit 16 comprises a resistor R6 which connects the connection between the power source B and the base of Q4 to ground, a resistor R5 and a capacitor C13 which parallellingly connects the connection between the cathode of CR11 and the gate of CR10 to ground, a resistor R7 and a capacitor C15 which parallellingly connects the connection between the resistor R15 and the TRIG pin to ground.

The physical characteristics of R6, R8 and Q4 are designed to complement the characteristics of power sources A and B, such that together they ground the collector of Q4 before Q3 can be turned on, if any power supplied from power source B is above $V_B$ before power source A rises above $V_A$. For example, R6, R8, and Q4 may be designed to ground the collector of Q4 before Q3 can be turned on, if any power supplied from power source B is above 1.0 volt before power source A rises above 4.5 volts.

Similarly, the characteristics of CR10 and CR11 are designed to be such that when the collector of Q4 is grounded, the anode of CR11 will be below a predetermined voltage ($V_{CR11\text{-}A}$), thereby causing the cathode to be below another predetermined voltage ($V_{CR11\text{-}C}$), the minimum trigger voltage necessary to close CR10 ($V_{CR10\text{-}G}$). For example, CR11 may be designed such that when the collector of Q4 is grounded, the anode of CR11 is below 0.5 volt, thereby causing the cathode of CR11 to be below 0.1 volt, the minimum trigger voltage necessary to close CR10.

When CR10 is open, its cathode is effectively grounded through R15 and R7, thereby causing the RESET pin of the threshold detector to be grounded, driving the RESET input low. Even if Q3 is subsequently turned on, CR10 will remain open. Thus, the RESET pin of the threshold detector remains grounded, and the RESET input remains low.

On the other hand, if all the power supplies from power source B are below $V_B$, then the collector of Q4 is open, allowing the anode of CR11 to be electrically connected to power source A through R8 and Q3. Thus, when Q3 is turn on, the cathode of CR11 will exceed $V_{CR11\text{-}C}$, the minimum voltage necessary to trigger and turn on CR10 $V_{CR10\text{-}G}$. Once CR10 is turn on, the RESET pin is set, driving the RESET input to high.

Additionally, R6 is also used to pull down on the base of Q4 preventing the self-biasing of Q4 when there is no other current path from power source B to ground. R5 is used to provide a path to ground when no current is sourced through CR11, preventing CR10 from triggering, since a voltage sufficiently high to trigger CR10 is easily developed across R5 when sufficient current is present at the cathode of CR11. C13 is used as a noise suppressor which keeps electrostatic discharge events from triggering CR10. C15 serves as a time delay, ensuring that after the RESET input of the threshold detector goes high (inactive), the TRIG input of the threshold detector stays low (active). The function and usage of the TRIG input of the threshold detector will be described later, when low voltage protection is described.

Figure 4:
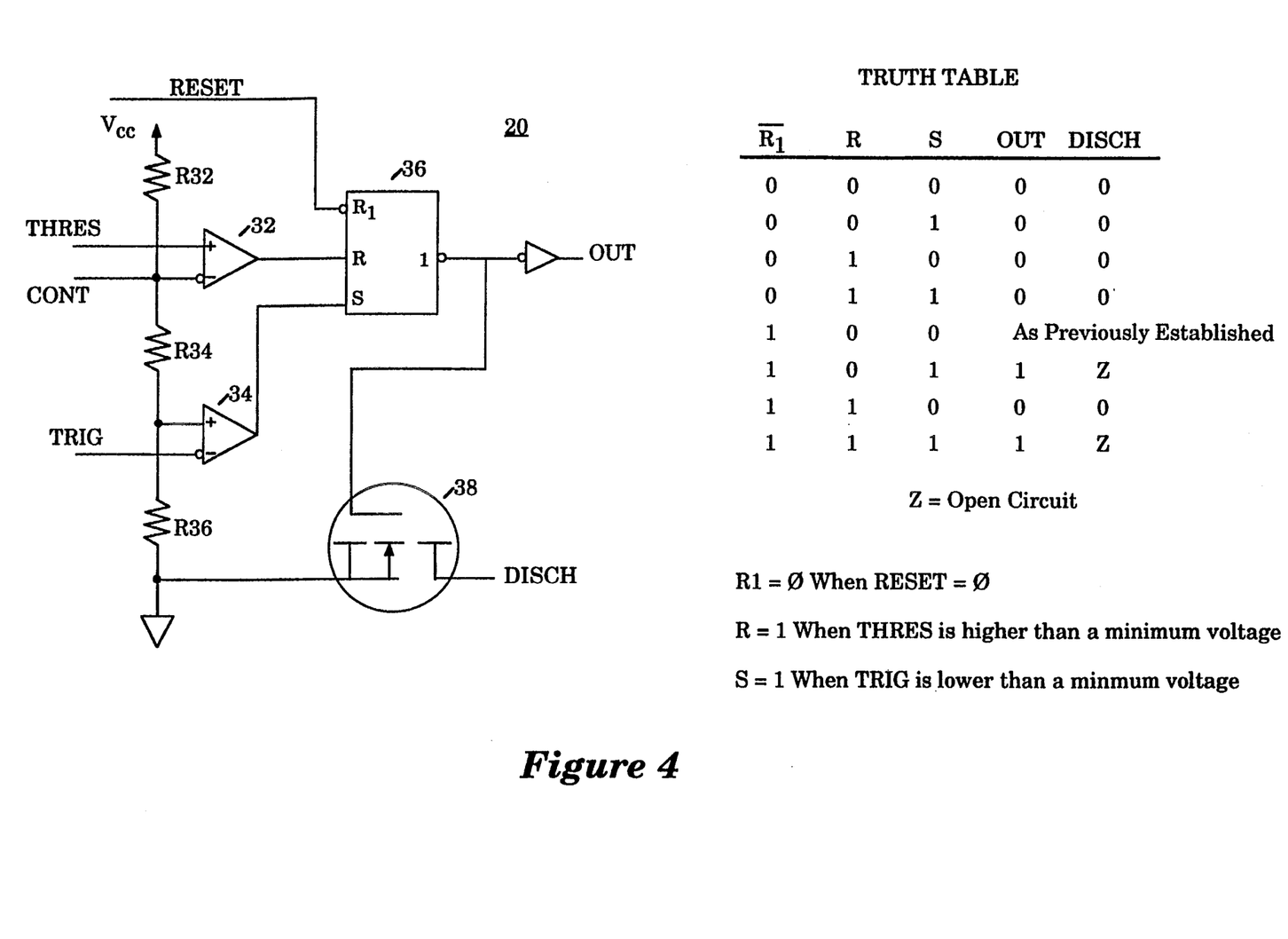
FIG. 4 illustrates the threshold detector of FIG. 2.

Referring now to FIG. 4, a circuit diagram illustrating one embodiment of the threshold detector is shown. In this embodiment, the threshold detector 20 comprises two comparators, 32 and 34, a sequential logic 36, a FET transistor switch 38, and a number of resistors, R32–R34. The threshold detector 20 receives a first and a second input, RESET and TRIG, from the latchup detection circuit, a third input THRES from the voltage reference and detection circuit, and power supply from power source A. In response, the threshold detector 20 outputs a first and a second output, OUT and DISCH.

The RESET input drives the R1 input of the sequential logic 36 directly. R1 is low when RESET is low. The THRES input and the voltage level of power source A drives the R input of the sequential logic 36 through the first comparator 32. R is high when THRES is higher than a predetermined minimum voltage. Similarly, the TRIG input and the voltage level of power source A drives the S input of the sequential logic 36 through the second comparator 34. S is high when TRIG is lower than a predetermined minimum voltage. The output of the sequential logic 36 drives the OUT output directly, and the DISCH output through the FET transistor switch 38 in conjunction with the power supply from power source A. The various output states of the OUT and DISCH output are given in the truth table in FIG. 4.

Figure 5:
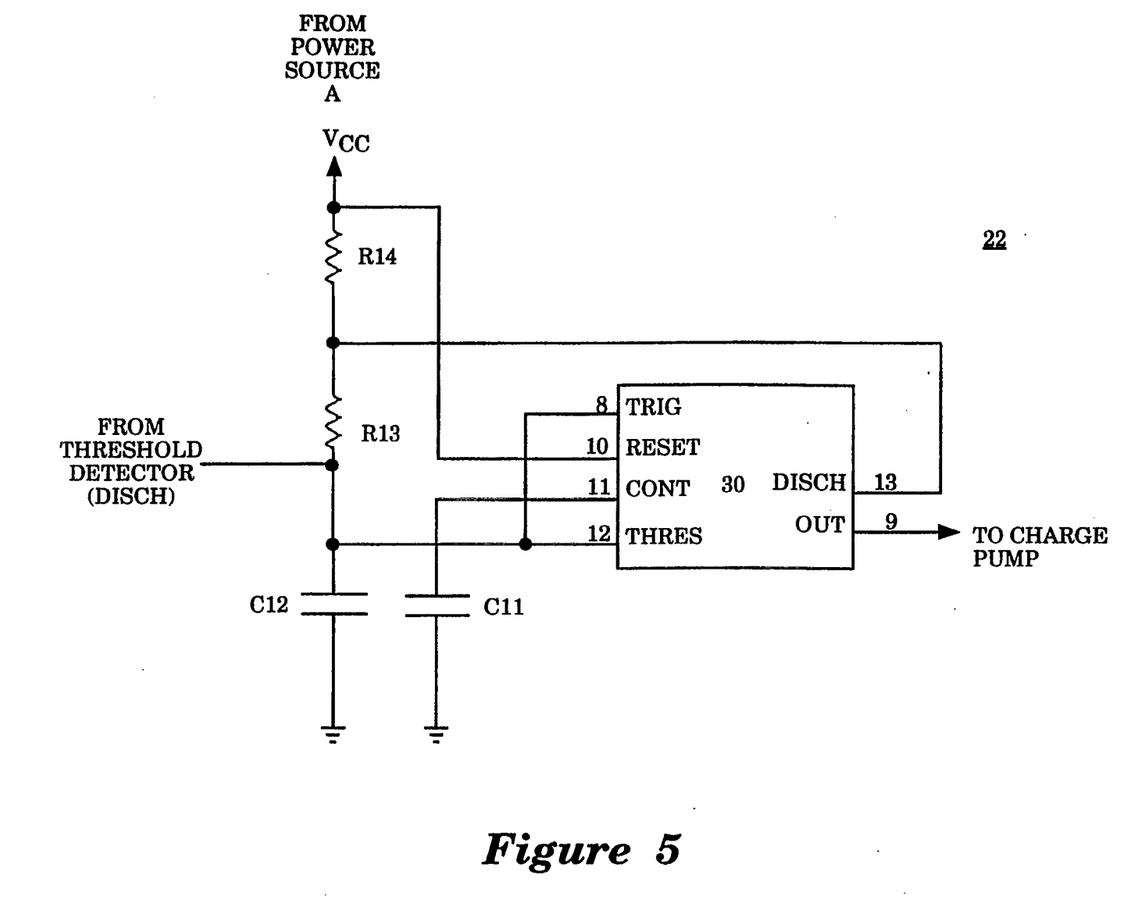
FIG. 5 illustrates the oscillator of FIG. 2.

Referring now to FIG. 5, a circuit diagram illustrating one embodiment of the oscillator is shown. In this embodiment, the oscillator 22 comprises an internal timer 30, two capacitors C11 and C12, and two resistors R13 and R14. The oscillator 22 receives the DISCH output from the threshold detector as input and power supply from power source A. In response, the oscillator 22 conditionally outputs current pulses to the charge pump.

The internal timer 30 comprises six pins, pin 8 TRIG, pin 10 RESET, pin 11 CONT, pin 12 THRES, Pin 9 OUT, and pin 13 DISCH. Pin 10 RESET is coupled to power source A and to ground through R14, R13, and C12. Pin 8 TRIG and pin 12 THRES are coupled to power source A through R13 and R14, to pin 13 DISCH through R 13, and to ground through C12. The manner in which these elements cooperate to function as an oscillator and generate current pulses is well known and will not be further described here.

The oscillator 22 is allowed to oscillate, thereby sourcing current pulses to the charge pump, when the DISCH output of the threshold detector is high, releasing the feedback path of the oscillator 22. The oscillator 22 is prevented from oscillating, thereby depriving current pulses to the charge pump, when the DISCH output of the threshold detector is low, grounding the feedback path of the oscillator 22.

The physical characteristics of these elements are designed to achieve an oscillating frequency that complements the load to be placed on the charge pump. The internal timer 30 may be implemented with circuitry similar to the threshold detector described earlier or its equivalent. Additionally, even though the oscillator 22 is described as a "timer-based" oscillator, it will be appreciated that the present invention may be practiced with "non-timer based" oscillators.

Figure 6:
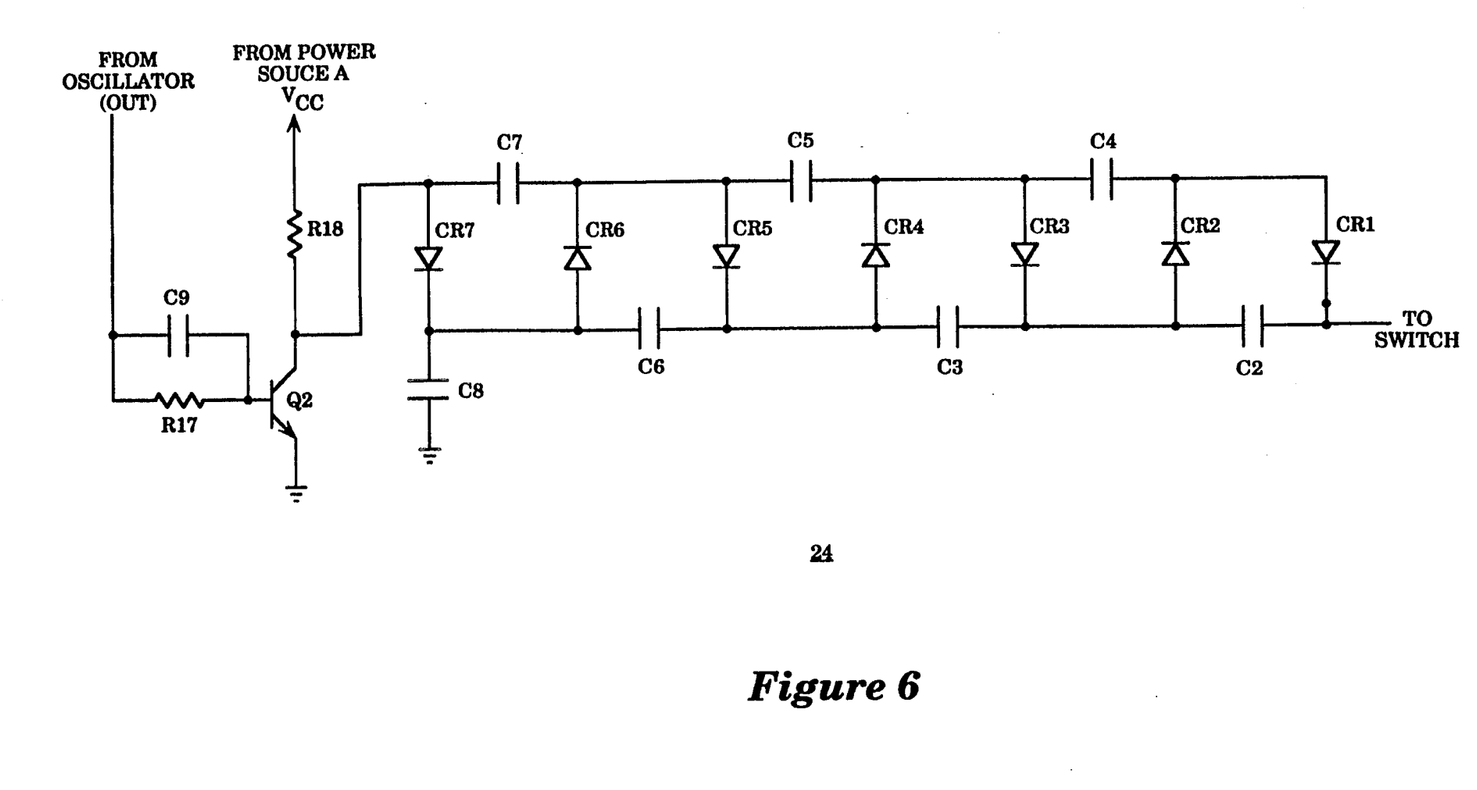
FIG. 6 illustrates the charge pump of FIG. 2.

Referring now to FIG. 6, a circuit diagram illustrating one embodiment of the charge pump is shown. In this embodiment, the charge pump 24 comprises a npn transistor Q2 and a brigade of capacitor-diode buckets CR1-CR7 and C2-C8. Additionally, the charge pump comprises a speedup capacitor C9 and two resistors R17 and R18. The charge pump receives current pulses as input through the OUT output of the oscillator and power supply from power source A. In response, the charge pump boost the voltage and output the boosted voltage to the switching circuit.

The base of Q2 is coupled to the oscillator output through the speedup capacitor C9 or the resistor R 17, the emitter of Q2 is coupled to ground, and the collector of Q2 is coupled to power source A through the resistor R18 and the capacitor-diode bucket brigade, CR1-CR7 and C2-C8. The resistor R17 serves as a current limiter to the base of Q2, and the speedup capacitor C9 is used to improve the efficiency of the charge pump 24. In order for the charge pump to operate efficiently, the waveform entering it must transition all the way from $V_{cc}$ to ground. One way to ensure that is to get the fastest possible edges out of the collector of Q2. To do so, the charges in the saturated base-collector junction of Q2 must be swept out quickly, preventing a large delay between grounding the base and floating the collector of Q2. The speedup capacitor C9 provides an additional path from the base of Q2 to ground when the input to R17 drops from some voltage to ground. Since C9 is discharged, this additional path initially looks like a short to ground. This low resistance path is only temporary, until C9 is charged up with the charge in the collector-base junction of Q2, thereby sweeping the charges out of the base-collector junction of Q2 quickly.

The diode-capacitor matrix, CR1-CR7 and C2-C8, cooperate to produce a steady state voltage 4× of $V_{cc}$ for the switching circuit. The manner in which the diode-capacitor matrix cooperate to achieve the desired boosted voltage is well known and will not be further described here. While the charge pump has been illustrated with an embodiment that yield $4 \times V_{CC}$, it will be appreciated that the present invention may be practiced with a charge pump having pump capacity that is greater or smaller than the embodiment illustrated, depending on the characteristics of the switching circuit. The boosted voltage must be high enough to close the switching circuit, and the charge pump current capacity must be high enough to provide the voltage required by the switching circuit.

Figure 7:
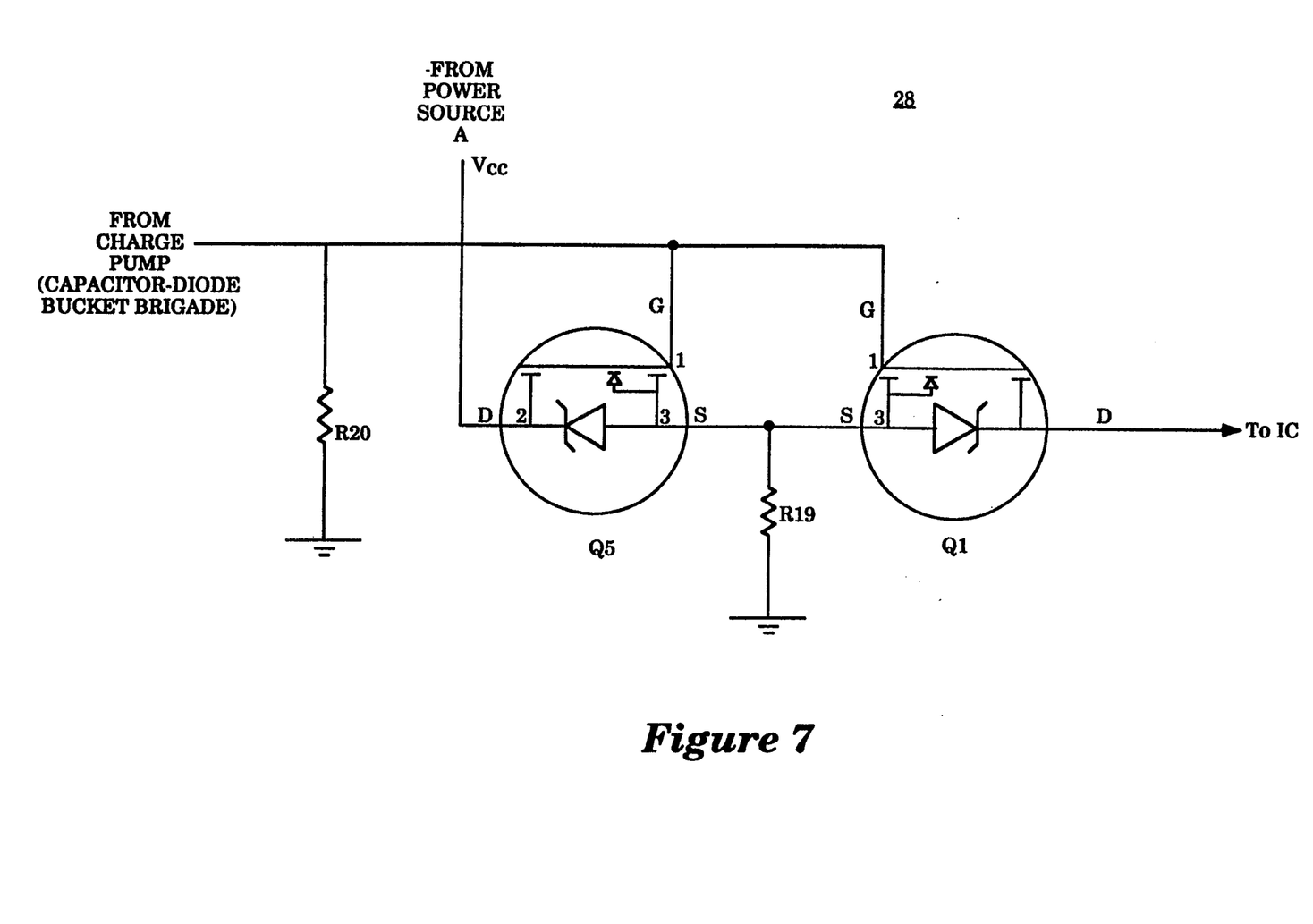
FIG. 7 illustrates the switching circuit of FIG. 2.

Referring now to FIG. 7, a circuit diagram illustrating one embodiment of the switching circuit is shown. In this embodiment, the switching circuit 28 comprises two resistors, R19 and R20, and two FET transistor switches, Q1 and Q5. The switching circuit receives the boosted voltage from the capacitor-diode bucket brigade of the charge pump as input, and power supply from power source A. In response, the switching circuit 28 closes, allowing the power supply from power source A to be provided to the CMOS integrated circuit.

Q1 and Q5, are connected in series at their sources, thereby causing their zener diodes to be connected in opposing fashion. The drain of Q5 is coupled to power source A, whereas the drain of Q1 is coupled to the CMOS integrated circuit. The gates of Q1 and Q5 are coupled to last capacitor-diode bucket of the capacitor-diode bucket brigade of the charge pump. Additionally, the connection between the sources of Q1 and Q5, and the connection between the gates of Q1 and Q5 and the capacitor-diode bucket brigade, are grounded through R19 and R20 respectively.

Thus, when the pumped up voltage is applied to the gates of Q1 and Q5 by the charge pump, Q1 and Q5 close, thereby allowing power to be supplied from power source A to the CMOS integrated circuit. R 19 serves as a source reference for the gates of Q1 and Q5, to guard against the unlikely event that the switch is prevented from closing by a high voltage at the drain of Q1. On the other hand, when the pumped up voltage is withdrawn from the gates of Q1 and Q5 after the charge pump is shut off, Q 1 and Q5 open, thereby depriving the CMOS integrated circuit of power supplied from power source A. R20 serves at a gate leakage resistor, allowing the gates of Q1 and Q5 to discharge quickly after the charge pump has shut off, thereby quickly opening the switching circuit 28 and quickly depriving power supply from power source A from the CMOS integrated circuit.

The current capacity of the switching circuit 28 is designed to complement the load presented by the CMOS integrated circuit to be protected. The gate bleeder resistor R20 is designed to be large enough to prevent dropping the pumped up voltage, and yet small enough to give a satisfactory quick turn-off time for the switching circuit. Additionally, it will be appreciated that the zener diodes of the Q 1 and Q5 are not "enabling" elements of the present invention, they are more like "constraints" imposed by the present FET technology, that the present invention has to contend with.

Still referring to FIG. 7, reverse current protection will next be described. Since Q1 and Q5 are connected in series at their sources, causing their zener diodes to be connected in opposing fashion. At any particular point in time, one of the zener diodes will be reversed biased. Thus, current will be shut off, whenever the gates of Q 1 and Q5 are grounded, regardless whether the drain of Q5 or Q1 is energized. Thus, if power source A is deenergized unexpectedly, causing the gates of Q1 and Q5 to be grounded, the switching circuit will quickly open, preventing current to be sourced from power source B, through the CMOS integrated circuit and the electrical protection circuit of the present invention to power supply A.

Referring back to FIG. 2, low voltage protection will next be described. The voltage reference and detection circuit 18 is used to provide voltage to pull the THRES input of the threshold detector 20 above its trigger range upon detecting a low voltage condition, and allow the THRES input to fall below the trigger range in the absence of the low voltage condition. A low voltage condition exists when the voltage of power source A falls below $V_A$. Concurrently, the voltage reference and detection circuit 18 is also used to reverse biased the base-emitter junction of Q3 in the latchup detection circuit 18 upon detecting the low voltage condition. The latchup detection circuit 16 is also used to ground the TRIG and RESET inputs of the threshold detector 20, whenever the base-emitter junction of Q3 is reverse biased. The threshold detector 20 is used to shutoff the oscillator 22 as a result of its TRIG and RESET inputs being grounded, thereby shutting off the charge pump 24, opening up the switching circuit 28, and depriving the CMOS integrated circuit of power from power source A. The threshold detector 20 is also used to allow current to be sourced to the signaling circuit 26 as a result of its THRES input being pulled above the trigger range. The signaling circuit 26 is used to generate a number of signals indicating a low voltage condition, thereby preventing erroneous reconfiguration of SRAM-based FPGA on the CMOS integrated circuit.

Figure 8:
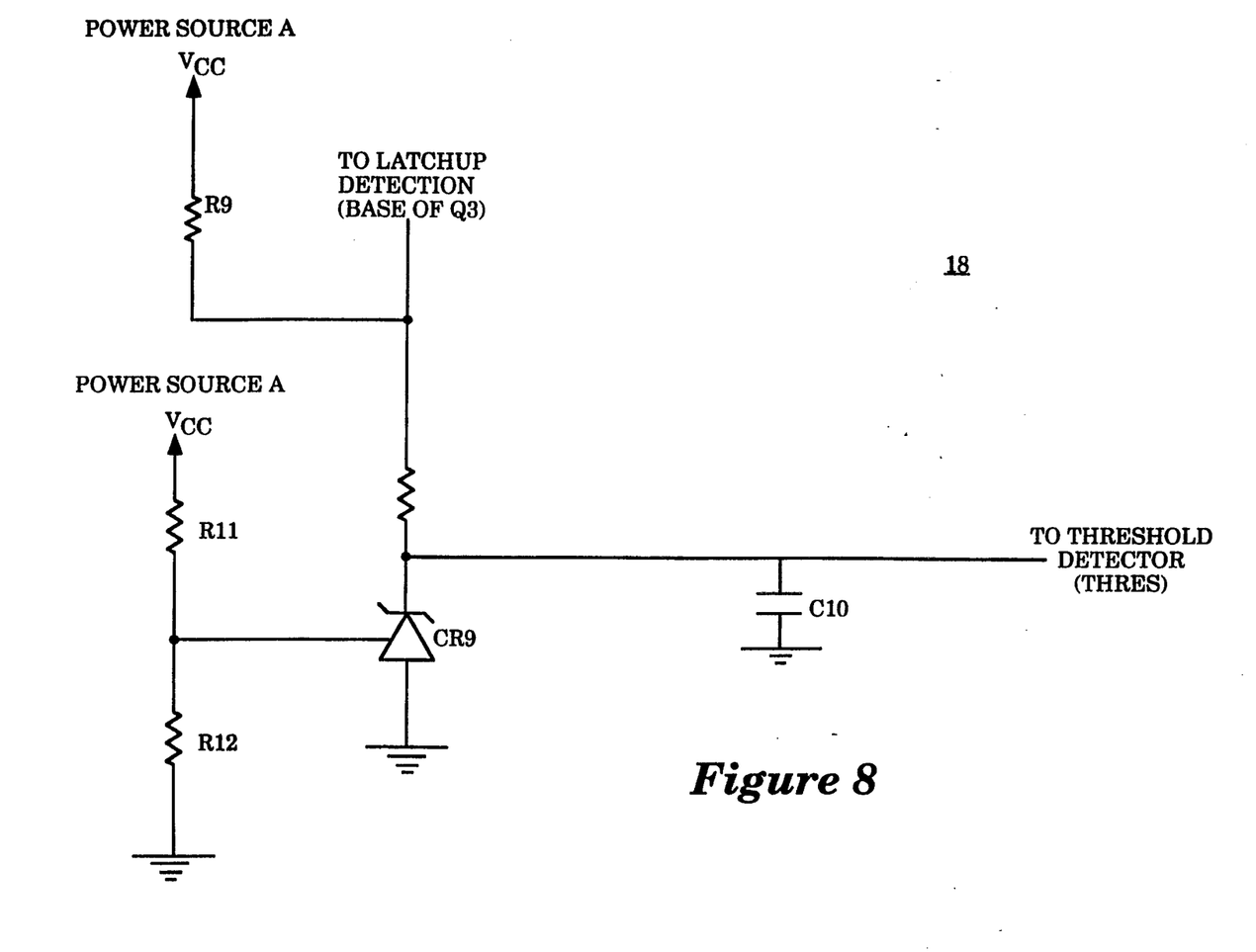
FIG. 8 illustrates the voltage reference and detection circuit of FIG. 2.

Referring now to FIG. 8, a circuit diagram illustrating the voltage reference and detection circuit in further detail is shown. The voltage reference and detection circuit 18 comprises a zener diode CR9, two pairs of resistors, R9 and R10, and, R11 and R12, and a capacitor C10. The voltage reference and detection circuit 18 receives power supply from power source A. In response, the voltage reference and detection circuit 18 allows power from power source A to be sourced to the base of Q3 of the latchup detection circuit, and the THRES input of the threshold detector.

The cathode of CR9 is coupled to power source A through the resistor pair R9 and R10, to the base of Q3 in the latchup detection circuit through R10, and to the THRES input of the threshold detector. The anode of CR9 is coupled to ground, and the gate is coupled also to power source A through R11. Additionally, the connection between the cathode of CR9 and the THRES input is coupled to ground through C10, and the connection between the gate of CR9 and R11 is coupled to ground through R 12.

When the voltage of power source A goes below $V_A$, CR9 becomes an open circuit. The cathode of CR9 goes to $V_{cc}$ through R9 and R10. The THRES input of the threshold detector is also pulled to $V_{cc}$ through the same resistors, thereby pulling it above its trigger range. Concurrently, when CR9 becomes open, the base-emitter junction of Q3 in the latchup detection circuit becomes reverse biased. C10 keeps the THRES pin below the trigger range (inactive) while $V_{cc}$ is ramping up. When $V_{cc}$ settles below the trigger range of CR9 indicating a lower power source A voltage condition, then CR9 will remain open, allowing C10 to charge up to the trigger range, resetting the threshold detector, keeping the switching circuit open. When $V_{cc}$ settles above the trigger range of CR9 indicating a satisfactory power source A voltage condition, then CR9 will close, preventing CR10 from changing up to the trigger voltage of the THRES input allowing TRIG to control the state of OUT and DISCH outputs. Since power source A supplies $V_{cc}$ to charge C10 as well as $V_{cc}$ to the threshold detector, and since the trigger range of the THRES input is a function of $V_{CC}$, then the delay induced by C10 between the ramp-up of the THRES input versus the ramp-up of $V_{cc}$ is sufficient to hold the THRES input below its trigger range until CR9 closes.

Referring back to FIGS. 3-4, when the opening of CR9 in the voltage reference and detection circuit causes the base-emitter junction of Q3 of the latchup detection circuit to be reverse biased, the collector of Q3 is grounded through CR10, R 15 and R7 of the latchup detection circuit 16. Thus, the RESET as well as the TRIG inputs of the threshold detector 20 also get grounded. As described earlier, the opening of CR9 in the voltage reference and detection circuit also causes the THRES input to be pulled above its trigger range. As a result, as illustrated by the truth table in FIG. 4, both the OUT and DISCH outputs of the threshold detector 20 are grounded.

Figure 9:
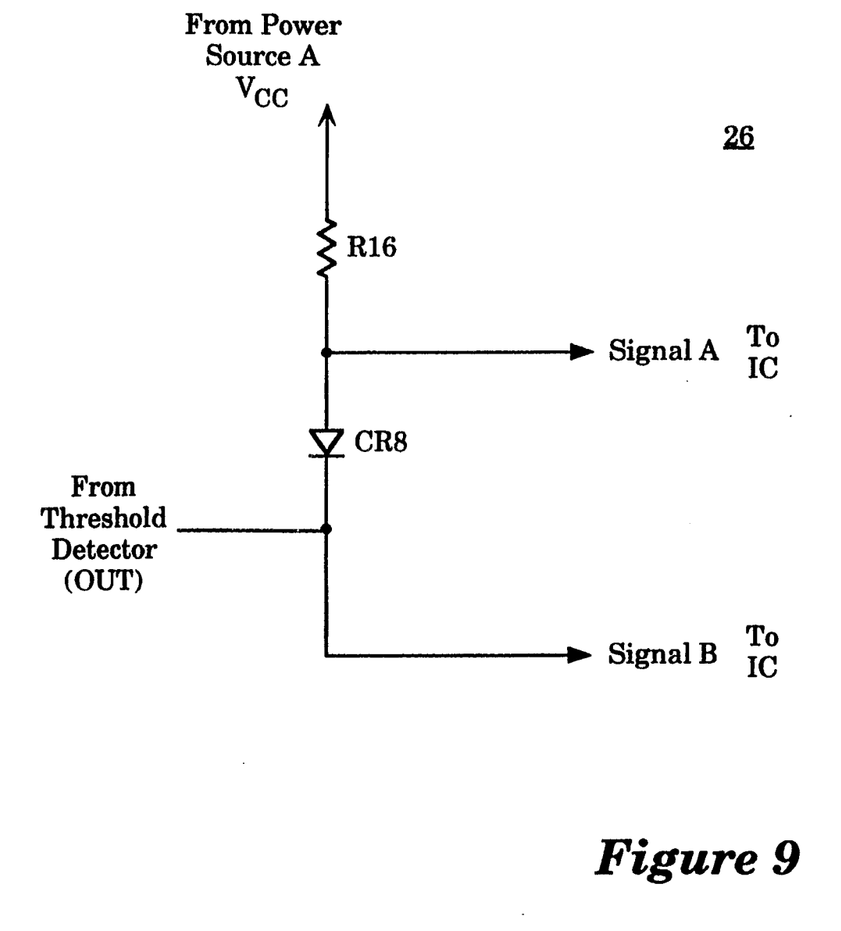
FIG. 9 illustrates the signaling circuit of FIG. 2.

Referring now to FIG. 9, a circuit diagram illustrating one embodiment of the signal generator is shown. In this embodiment, the signaling circuit 26 comprises a diode CR8 and a resistor R16. The signal generating circuit receives the OUT output of the threshold detector as input, and power supply from power source A. In response, the signaling circuit 26 generates two signals, A and B. Signal A is provided to a configuration engine coupled to the CMOS integrated circuit for configuring the SRAM-based FPGA of the CMOS integrated circuit. Having been notified of the low voltage condition, the configuration engine reloads the SRAM-based FPGA when the fault condition is cleared. Signal B is provided to an isolation gate coupled to the CMOS integrated circuit for isolating the CMOS integrated circuit from other CMOS integrated circuits receiving power supply from power source B only. Upon receipt of the notification, the isolation gate isolates the CMOS integrated circuit.

The anode of CR8 is coupled to power source A through R16, and the cathode is coupled to OUT of the threshold detector. Additionally, the connection between the anode of CR8 and R16, and the connection between the cathode of CR8 and the OUT output of the threshold detector, are coupled to the configuration engine and the isolation gate respectively. When the OUT output of the threshold detector is clamped to ground, it is driven low and causes the signals A and B to be provided to the configuration engine and the isolation gate respectively.

While the signaling circuit is being described with an embodiment that generates two signals, it will be appreciated that the present invention may be practiced alternative embodiments that generate more or less signals used for similar or different purposes.

While the present invention has been described in terms of presently preferred and alternate embodiments, those skilled in the art will recognize that the invention is not limited to the embodiments described. The method and apparatus of the present invention can be practiced with modification and alteration within the spirit and scope of the appended claims. The description is thus to be regarded as illustrative instead of limiting on the present invention.

What is claimed is:

1. A circuit for protecting a CMOS integrated circuit from latching up as a result of improper application of power to said CMOS integrated circuit, said CMOS integrated circuit receiving power supplies from more than one power source, said circuit comprising:
   a) a latchup detection circuit coupled to said power sources of said CMOS integrated circuit for detecting certain predetermined power differential pattern between a first and the remainder of said power sources and sourcing a first output current in response;
   b) a threshold detector coupled to said latchup detection circuit and said first power source for receiving said first output current from said latchup detection circuit and power from said first power source, and sourcing a second output current in response;
   c) an oscillator coupled to said threshold detector and said first power source for receiving said second output current from said threshold detector and power from said first power source, and alternatingly sourcing a third and a fourth output current in response;
   d) a charge pump coupled to said oscillator and said first power source for receiving said third and fourth output current alternatingly from said oscillator and power from said first power source, and providing a steady output voltage larger than said first power source' voltage; and
   e) a switching circuit coupled to said charge pump, said first power source, and said CMOS integrated circuit for receiving said steady output voltage from said charge pump and power from said first power source, and closing itself in response, allowing said power from said first power source to be provided to said CMOS integrated circuit.

2. The circuit as set forth in claim 1, wherein, said predetermined power differential pattern is a pattern under which one of said remainder power sources rises above a first predetermined voltage before said first power source rises above a second predetermined voltage.

3. The circuit as set forth in claim 2, wherein, said latchup detection circuit comprises:
   a.1) a pnp transistor coupled to said first power source and ground;
   a.2) a npn transistor coupled to said pnp transistor, the remainder power sources, and ground;
   a.3) a diode coupled to said pnp and npn transistors; and
   a.4) a silicon controlled rectifier coupled to said pnp transistor, said diode, said threshold detector, and ground.

4. The circuit as set forth in claim 1, wherein, said threshold detector comprises:
   b.1) first comparator means coupled to a voltage detection and reference circuit and said first power source for comparing a THRES input from said voltage detection and reference circuit to said first power source' voltage, and outputting a first comparison output;
   b.2) second comparator means coupled to said latchup detection circuit and said first power source for comparing a TRIG input from said latchup detection and reference circuit to said first power source' voltage, and outputting a second comparison output;
   b.3) combinatorial logic means coupled to said latchup detection circuit, said first and second comparator means for receiving a RESET input from said latchup detection circuit, and said first and second comparison outputs from said first and second comparator means respectively, and outputting a first threshold detector output; and
   b.4) transistor switch means coupled to said combinatorial logic means and said first power source for receiving said first threshold detector output from said combinatorial logic means and said power from said first power source, and outputting a second threshold detector output.

5. The circuit as set forth in claim 1, wherein, said oscillator comprises
   c.1) a first capacitor coupled to said first power source, said threshold detector and ground;
   c.2) a second capacitor coupled to ground; and
   c.3) an internal timer coupled to said first power source, said threshold detector, said first and second capacitors, and said charge pump.

6. The circuit as set forth in claim 1, wherein, said charge pump comprises:
   d.1) a capacitor-resistor combination coupled to said oscillator;
   d.2) a npn transistor coupled to said capacitor-resistor combination, said first power source and ground; and
   d.3) a capacitor-diode bucket brigade comprising a plurality of capacitor-diode buckets coupled to said npn transistor, said first power source, and said switching circuit.

7. The circuit as set forth in claim 1, wherein, said switching circuit comprises:
   e.1) a first transistor switch comprising a first zener diode coupled to said power source, said charge pump; and
   e.2) a second transistor switch comprising a second zener diode coupled to said first transistor switch, said first power source and said CMOS integrated circuit.

8. The circuit as set forth in claim 7, wherein,
   said circuit further provides reverse current protection for said CMOS integrated circuit;
   said first and second transistor switches are coupled to each other serially at their sources with their zener diodes opposing each other, and coupled to said charge pump at their gates.

9. The circuit as set forth in claim 1, wherein,
   said circuit further provides low voltage protection to said CMOS integrated circuit's SRAM-based FPGA;
   said circuit further comprises a voltage reference and detection circuit coupled to said first power source, said latchup detection circuit, and said threshold detector, for detecting a predetermined voltage drop pattern of said first power source, and sourcing a fifth output current to said threshold detector in response, said voltage reference and detection circuit also opening said latchup detection circuit in response;

said latchup detection circuit cuts off said first output current and a seventh output current to said threshold detector in response;

said threshold detector cuts off said second output current to said oscillator and drives low an output signal in response;

said oscillator cuts off said third and fourth output current to said charge pump in response;

said charge pump cuts off said steady output voltage to said switching circuit in response;

said switching circuit opens itself in response, depriving said CMOS integrated circuit of said power from said first power source;

said circuit further comprises a signaling circuit coupled to said threshold detector and said CMOS integrated circuit for receiving said low output signal and outputting a plurality of low voltage indicator signals.

10. The circuit as set forth in claim 9, wherein, said voltage reference and detection circuit comprises a zener diode coupled to said first power source, said threshold detector, and ground.

11. The circuit as set forth in claim 9, wherein, said low voltage indicator signals comprise a first and a second signal, said first signal being provided to a configuration engine coupled to said CMOS integrated circuit for configuring SRAM-based software-downloaded Field Programmable Gate Array (FPGA) of said CMOS integrated circuit, said second signal being provided to an isolation gate coupled to said CMOS integrated circuit for isolating said CMOS integrated circuit from other CMOS integrated circuits receiving power supply from the remaining power sources;

said signaling circuit comprises a diode coupled to said first power source, said threshold detector, said configuration engine and said isolation gate.

12. A circuit comprising:
a) state indicating means coupled to a first and a second power source comprising a silicon controlled rectifier for indicating one of two states, said state indicating means having the following state transition rules:
   a.1) if said state indicating means is in a first state and said second power source is on, said state indicating means stays in said first state;
   a.2) if said state indicating means is in said first state, said second power source is off, and said first power source is on, said state indicating means goes into a second state;
   a.3) if said state indicating means is in said second state and said first power source is on, said state indicating means stays in said second state;
   a.4) if said state indicating means is in said second state and said first power source is off, said state indicating means goes into said first state; and
b) enabling means coupled to said state indicating means, said first power source, and a CMOS integrated circuit for sourcing power from said first power source to said CMOS integrated circuit when said state indicating means is in said second state, and depriving power from said first power source to said CMOS integrated circuit when said state indicating means is in said first state.

* * * * *

UNITED STATES PATENT AND TRADEMARK OFFICE
CERTIFICATE OF CORRECTION

PATENT NO.    : 5,392,186
DATED         : February 21, 1995
INVENTOR(S)   : Alexander et al.

It is certified that error appears in the above-identified patent and that said Letters Patent is hereby corrected as shown below:

In column 4, at line 52, delete "The 1.5 electrical" and substitute --The electrical--.

Signed and Sealed this

Twenty-ninth Day of October 1996

Attest:

BRUCE LEHMAN

Attesting Officer

Commissioner of Patents and Trademarks